(12) United States Patent
Weng

(10) Patent No.: US 12,341,094 B2
(45) Date of Patent: Jun. 24, 2025

(54) SEMICONDUCTOR STRUCTURE

(71) Applicant: CHANGXIN MEMORY TECHNOLOGIES, INC., Hefei (CN)

(72) Inventor: Kun Weng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 647 days.

(21) Appl. No.: 17/650,122

(22) Filed: Feb. 7, 2022

(65) Prior Publication Data

US 2022/0375848 A1     Nov. 24, 2022

Related U.S. Application Data

(63) Continuation of application No. PCT/CN2021/120350, filed on Sep. 24, 2021.

(30) Foreign Application Priority Data

May 19, 2021 (CN) .......................... 202110547455.5

(51) Int. Cl.
*H01L 23/528* (2006.01)
*H01L 23/522* (2006.01)

(52) U.S. Cl.
CPC ........ *H01L 23/528* (2013.01); *H01L 23/5226* (2013.01)

(58) Field of Classification Search
CPC ............... H01L 23/522; H01L 23/5222; H01L 23/5226; H01L 23/528; H01L 23/5221;
(Continued)

(56) References Cited

U.S. PATENT DOCUMENTS

2002/0190382 A1   12/2002   Kouno et al.
2004/0188849 A1   9/2004   Suga
(Continued)

FOREIGN PATENT DOCUMENTS

CN    1378266 A    11/2002
CN    1643525 A    7/2005
(Continued)

OTHER PUBLICATIONS

International Search Report cited in PCT/CN2021/120350 mailed Feb. 23, 2022, 8 pages.
(Continued)

*Primary Examiner* — Thanhha S Pham
(74) *Attorney, Agent, or Firm* — Syncoda LLC; Feng Ma

(57) ABSTRACT

The present disclosure provides a semiconductor structure, including: a plurality of metal layers and a substrate, wherein the plurality of metal layers include a first metal layer, a second metal layer, and a third metal layer; a plurality of virtual metal blocks and at least one signal line are disposed on the metal layers; the virtual metal blocks on the metal layers are staggered in a direction perpendicular to the substrate; a second distance between a projection of a target signal line on the substrate and a projection of a second virtual metal block on the substrate is greater than a first distance between the projection of the target signal line on the substrate and a projection of a first virtual metal block on the substrate; the target signal line is located on the first metal layer.

12 Claims, 4 Drawing Sheets

(58) Field of Classification Search
CPC ............. H01L 23/5227; H01L 23/5228; H01L 23/525; H01L 23/5283; H01L 23/5286; H01L 23/5223; H01L 23/5225; H01L 23/535
See application file for complete search history.

(56) References Cited

U.S. PATENT DOCUMENTS

| | | | |
|---|---|---|---|
| 2008/0164496 A1 | 7/2008 | Kawakami | |
| 2011/0248404 A1* | 10/2011 | Chiu | H01L 21/6835 257/773 |
| 2014/0151832 A1* | 6/2014 | Saiki | H01L 27/14603 257/431 |

FOREIGN PATENT DOCUMENTS

| | | | |
|---|---|---|---|
| CN | 102270625 A | 12/2011 | |
| CN | 102487056 A | 6/2012 | |
| CN | 104934408 A | 9/2015 | |
| JP | H0661230 A | 3/1994 | |
| KR | 20020050927 A | 6/2002 | |

OTHER PUBLICATIONS

US office action in U.S. Appl. No. 17/650,853, mailed on Mar. 14, 2024.
International Search Report cited in PCT/CN2021/120348 mailed Jan. 27, 2022, 8 pages.

\* cited by examiner

… (US 12,341,094 B2)

SEMICONDUCTOR STRUCTURE

CROSS-REFERENCE TO RELATED APPLICATIONS

This is a continuation of International Application No. PCT/CN2021/120350, filed on Sep. 24, 2021, which claims the priority to Chinese Patent Application No. 202110547455.5, titled "SEMICONDUCTOR STRUCTURE" and filed with the China National Intellectual Property Administration (CNIPA) on May 19, 2021. The entire contents of International Application No. PCT/CN2021/120350 and Chinese Patent Application No. 202110547455.5 are incorporated herein by reference.

TECHNICAL FIELD

The present disclosure relates to, but is not limited to a semiconductor structure.

BACKGROUND

The semiconductor integrated circuit device includes metal layers on which patterned metals are deployed. Some of the metals on the metal layers are used to transmit signals such as clock signals and control terminal signals of transistors.

As the integration density of the semiconductor integrated circuit device increases, especially in some complex integrated circuits, due to the parasitic effect generated by the patterned metals on the metal layers, the signal transmission on the metal layers is delayed, reducing the performance of the semiconductor integrated circuit. How to reduce the impact of the parasitic effect of the patterned metals has become a problem to be resolved urgently.

SUMMARY

The present disclosure provides a semiconductor structure, including a plurality of metal layers and a substrate, wherein the plurality of metal layers includes a first metal layer, a second metal layer, and a third metal layer;
  a plurality of virtual metal blocks and at least one signal line are disposed on the metal layers;
  the virtual metal blocks on the metal layers are staggered in a direction perpendicular to the substrate;
  a second distance between a projection of a target signal line on the substrate and a projection of a second virtual metal block on the substrate is greater than a first distance between the projection of the target signal line on the substrate and a projection of a first virtual metal block on the substrate; and the target signal line is located on the first metal layer;
  a third distance between the projection of the target signal line on the substrate and a projection of a third virtual metal block on the substrate is greater than the first distance; and
  the first virtual metal block is a virtual metal block, in the first metal layer, closest to the target signal line, the second virtual metal block is a virtual metal block, in the second metal layer, closest to the target signal line, and the third virtual metal block is a virtual metal block, in the third metal layer, closest to the target signal line.

BRIEF DESCRIPTION OF THE DRAWINGS

The accompanying drawings incorporated into the specification and constituting part of the specification illustrate the embodiments of the present disclosure, and serve, together with the specification, to explain the principles of the present disclosure.

Specific embodiments of the present disclosure are shown by using the accompanying drawings and are described below in more detail. The accompanying drawings and text description are not intended to limit the scope of the concept of the present disclosure in any manner, but to explain the concept of the present disclosure for those skilled in the art with reference to specific embodiments.

DETAILED DESCRIPTION

Exemplary embodiments are described in detail herein, and examples thereof are represented in the accompanying drawings. When the following descriptions relate to the accompanying drawings, unless otherwise stated, same digitals in different accompanying drawings represent same or similar essential factors. Implementations described in the following exemplary embodiments do not represent all implementations consistent with the present disclosure. On the contrary, the implementations are merely examples of apparatuses and methods that are described in detail in the appended claims and consistent with some aspects of the present disclosure.

Figure 1:
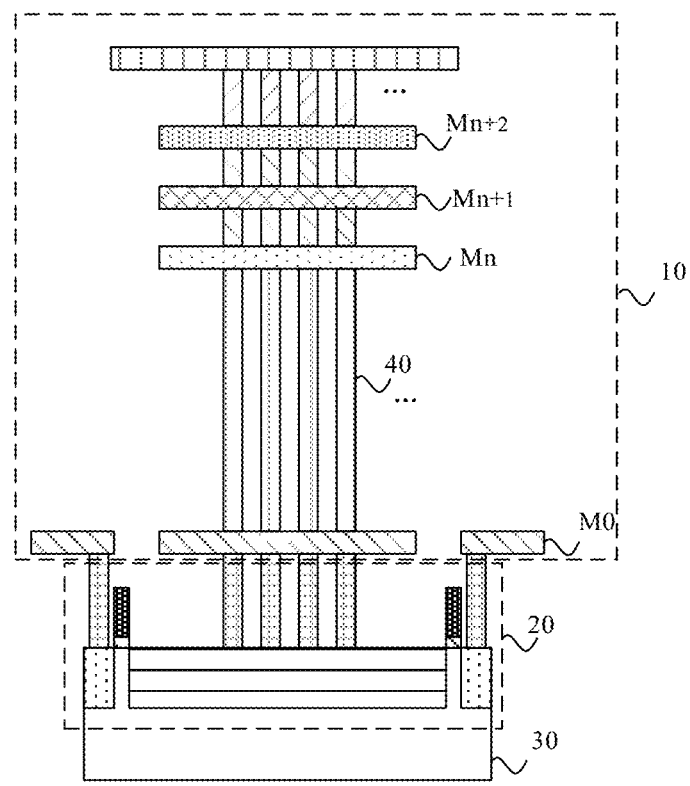
FIG. 1 is a front view of a semiconductor structure according to an embodiment of the present disclosure.

As shown in FIG. 1, a semiconductor structure includes a substrate 30, electronic parts 20 and a plurality of metal layers 10. The electronic parts 20 such as transistors are arranged on the substrate 30. The plurality of metal layers 10 are arranged on the electronic parts 20. For example, a metal layer M0, a metal layer Mn, a metal layer Mn+1, and a metal layer Mn+2 with increasing heights are provided. N is a natural number, that is, the metal layer Mn is higher than the metal layer M0, the metal layer Mn+1 is higher than the metal layer Mn, and the metal layer Mn+2 is higher than the metal layer Mn+1. The metal layers are electrically connected by using conductive plugs 40. Signal lines are arranged on some of the metal layers 10 to connect the electronic parts mutually, and also to connect the electronic parts to a ground pad or a power supply pad.

The signal lines of integrated circuits are usually made by using a dry etching process. The typical production process includes the following steps: A layout pattern of the signal lines is first drawn, and then the layout pattern of the signal lines is transferred to a semiconductor substrate by using a photolithography process. The semiconductor substrate refers to a semiconductor structure to be dry etched. Then, the semiconductor structure is dry etched. Metal layers or dielectric layers that are not covered by a photoresist medium are removed to form a desired semiconductor structure.

Figure 2:
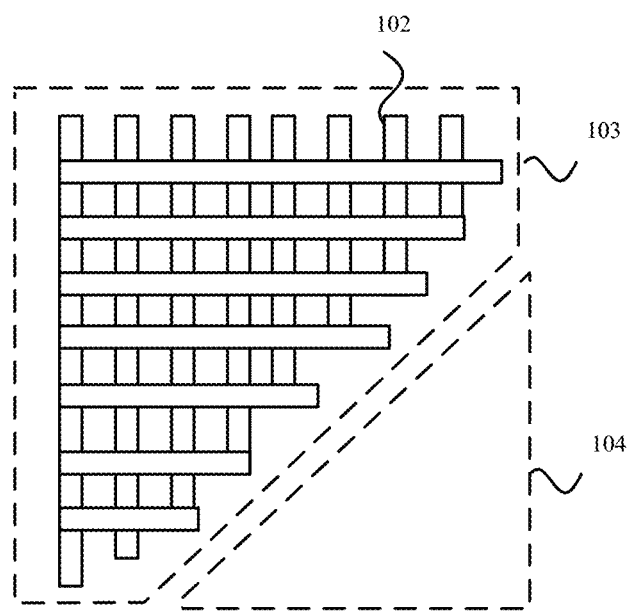
FIG. 2 is a schematic layout diagram of signal lines according to an embodiment of the present disclosure.
Figure 3:
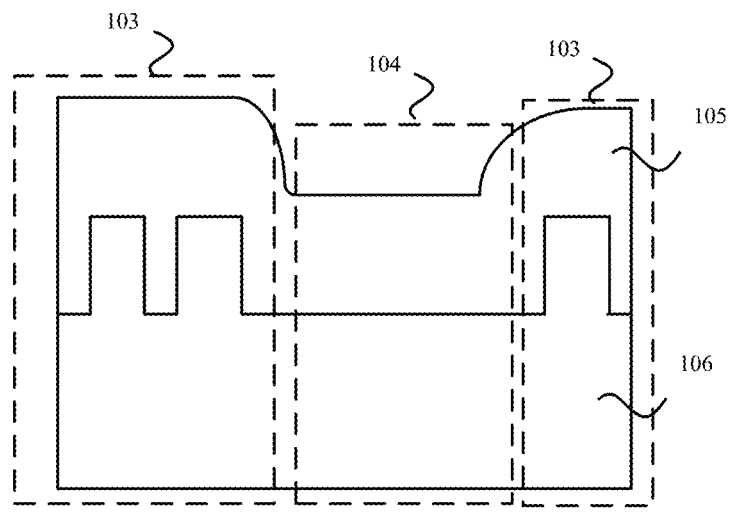
FIG. 3 is a schematic diagram of manufacturing a metal layer in the semiconductor structure according to an embodiment of the present disclosure.

As shown in FIG. 2, the distribution of the signal lines in each layer is generally uneven. According to the distribution regions of the signal lines, each layer may be divided into a dense region 103 of signal lines and a sparse region 104 of signal lines. The uneven distribution of the metal lines affects the manufacturing process of the semiconductor structure. As shown in FIG. 3, especially when a distance between two layers exceeds a certain value, and a current layer 106 is covered with a dielectric layer 105, the dielectric layer 105 is dish-shaped in the sparse region 104 of the signal lines. As a result, dielectric layer thicknesses in the dense region 103 of signal lines and the sparse region 104 of signal lines are significantly different.

The dry etching process is a chemical or chemical and mechanical mixing process, and its etching rate is related to the density of the components on the semiconductor substrate. Due to the uneven density of signal lines on the semiconductor substrate, the etching rate of a region with a high density of signal lines is significantly different from that of a region with a low density, causing etching difficulties, that is, the load effect.

Moreover, another factor affecting the etching process is the thickness of the dielectric layer 105 formed subsequently. Due to different densities of the signal lines on the semiconductor substrate, the dielectric layer is dish-shaped in the sparse region of signal lines, making it difficult to detect the etching end point when the dielectric layer is etched. Consequently, the dielectric layer is over-etched, or the etching process, before reaching the etching end point, stops, affecting the yield in the process of manufacturing the semiconductor structure.

Figure 4:
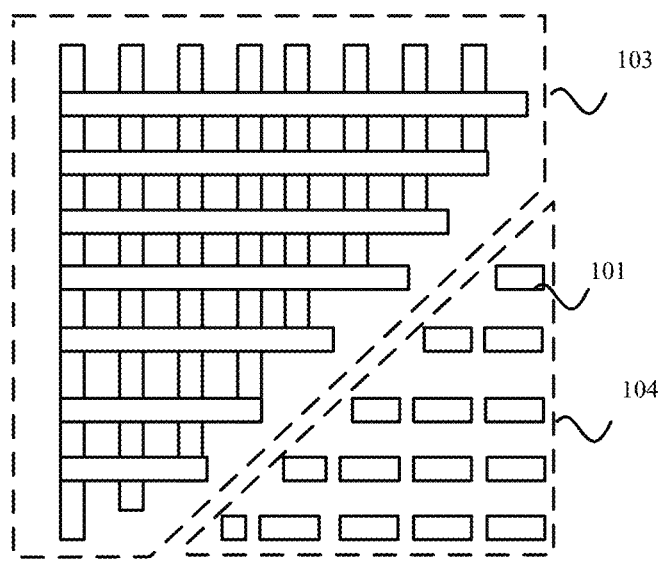
FIG. 4 is a schematic layout diagram of the signal lines and virtual metal blocks according to an embodiment of the present disclosure.

As shown in FIG. 4, to resolve the problem caused by uneven signal lines, virtual metal blocks are usually arranged in the sparse region of signal lines on each layer, so that the densities of the dense region of signal lines area and the sparse region of signal lines are the same. Different from the signal lines, the virtual metal blocks do not transmit signals.

The virtual metal blocks may be grounded, connected to a power supply, or in a floating state. When the virtual metal blocks are grounded or connected to the power supply, the parasitic capacitance value is increased. Therefore, the virtual metal blocks are usually in the floating state. It should be noted that the connection state of the virtual metal blocks is not limited herein.

An embodiment of the present disclosure provides a semiconductor structure, including the substrate 30 and the plurality of metal layers 10. Each metal layer is provided with signal lines. Virtual metal blocks are arranged on the metal layers with uneven signal lines, to make the lines on the metal layers uniform.

Description is made by using three adjacent metal layers: the metal layer Mn, the metal layer Mn+1, and the metal layer Mn+2 as an example. Signal lines are arranged on all of the metal layer Mn, the metal layer Mn+1, and the metal layer Mn+2, and the signal lines on the three metal layers are not uniformly distributed. In other words, each layer has a dense region of the signal lines and a sparse region of the signal lines.

Figure 5:
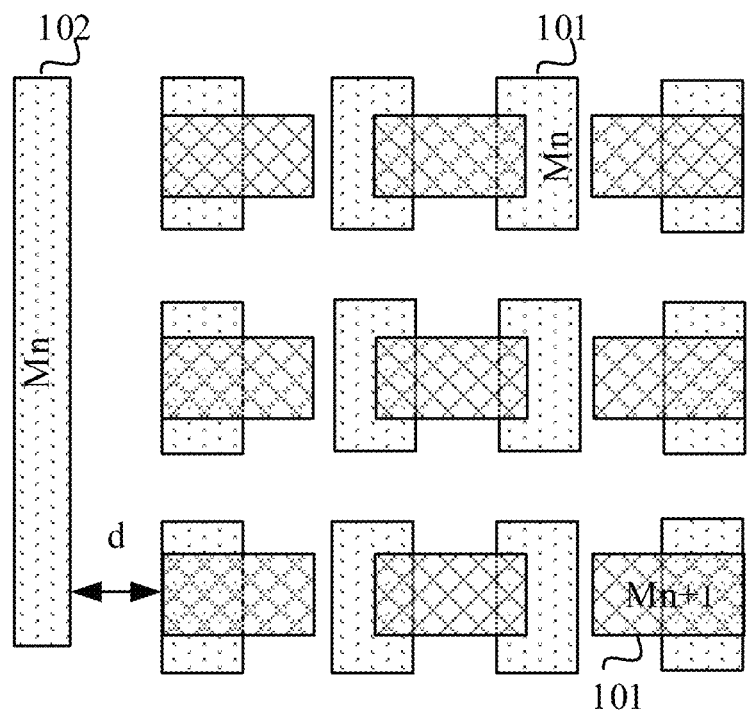
FIG. 5 is a schematic layout diagram of the virtual metal blocks in the semiconductor structure according to an embodiment of the present disclosure.
Figure 6:
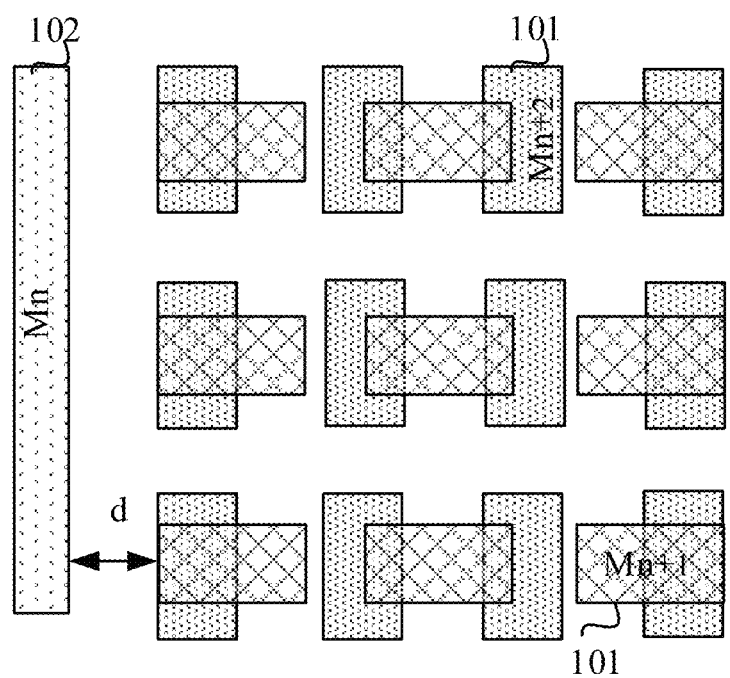
FIG. 6 is the schematic layout diagram of the virtual metal blocks in the semiconductor structure according to the embodiment shown in FIG. 5.

FIG. 5 and FIG. 6 are top views of the same semiconductor structure. FIG. 5 is a layout diagram of virtual metal blocks of the metal layer Mn and the metal layer Mn+1. FIG. 6 is a layout diagram of virtual metal blocks of the metal layer Mn+1 and the metal layer Mn+2.

As shown in FIG. 5, virtual metal blocks arranged in an array are disposed on the metal layer Mn. Each virtual metal block on the metal layer Mn is disposed in a first direction, for example, from top to bottom.

Virtual metal blocks arranged in an array are disposed on the metal layer Mn+1. Each virtual metal block on the metal layer Mn+1 is disposed in a second direction. The first direction is different from the second direction that is, for example, from left to right. Projections of the virtual metal blocks of the metal layer Mn on the substrate partially overlap projections of the virtual metal blocks of the metal layer Mn+1 on the substrate.

As shown in FIG. 6, the virtual metal blocks arranged in an array are disposed on the metal layer Mn+1. Each virtual metal block on the metal layer Mn+1 is disposed in the second direction. The virtual metal blocks arranged in an array are disposed on the metal layer Mn+2. Each virtual metal block on the metal layer Mn+2 is disposed in the first direction. The projections of the virtual metal blocks of the metal layer Mn on the substrate completely overlap projections of the virtual metal blocks of the metal layer Mn+2 on the substrate.

Through the above arrangement, the line densities of the metal layer Mn, the metal layer Mn+1, and the metal layer Mn+2 can be effectively compensated, so that the lines of each metal layer are more uniform.

Figure 7:
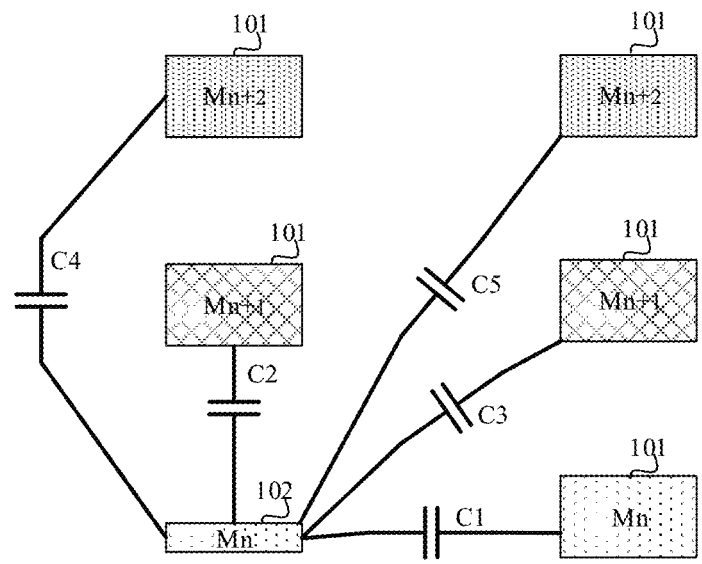
FIG. 7 is a schematic diagram of parasitic capacitances between the signal lines and the virtual metal blocks according to an embodiment of the present disclosure.

However, the semiconductor structure shown in FIG. 5 and FIG. 6 introduces relatively large parasitic capacitances on the signal lines. As shown in FIG. 7, a signal line 102 and a virtual metal block 101 on the same layer generate a parasitic capacitance C1. The signal line 102 and a virtual metal block 101 at the metal layer Mn+1 generate a parasitic capacitance C2. The signal line 102 and a virtual metal block 101 at the upper right of the metal layer Mn+1 generate a parasitic capacitance C3. The signal line 102 and a virtual metal block 101 at the metal layer Mn+2 generate a parasitic capacitance C4. The signal line 102 and a virtual metal block 101 at the upper right of the metal layer Mn+2 generate a parasitic capacitance C5.

It should further be noted that in addition to the parasitic capacitances generated on the metal signal lines, parasitic capacitances may also be generated between the virtual metal blocks. Especially when the projections of the virtual metal blocks on the substrate overlaps each other, the parasitic capacitances are relatively large. When the parasitic capacitances between the virtual metal blocks are relatively large, charges are likely to be collected on the virtual metal blocks in the manufacturing process, affecting the yield of the semiconductor structure manufacturing.

Figure 8:
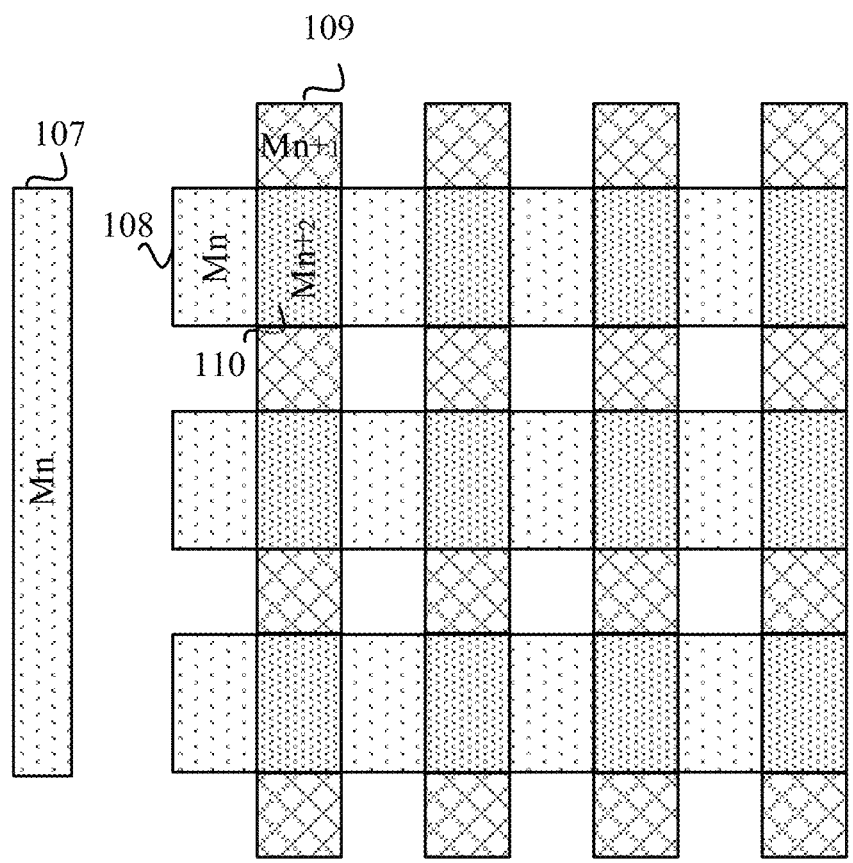
FIG. 8 is a schematic layout diagram of the virtual metal blocks in each metal layer according to an embodiment of the present disclosure.

As shown in FIG. 8, an embodiment of the present disclosure provides a semiconductor structure, including the plurality of metal layers 10 and the substrate 30. Each metal layer is provided with signal lines. Virtual metal blocks are provided on metal layers with uneven signal lines.

The virtual metal blocks on the metal layers are staggered in a direction perpendicular to the substrate, that is, the virtual metal blocks on all of the metal layers provided with virtual metal blocks are staggered in the direction perpendicular to the substrate. For example, the semiconductor structure is provided with L metal layers. Virtual metal blocks are provided on metal layers from Mn to Mn+2. Virtual metal blocks on the metal layer Mn and virtual metal blocks on the metal layer Mn+1 are staggered. The virtual metal blocks on the metal layer Mn and virtual metal blocks on the metal layer Mn+2 are staggered. The virtual metal blocks on the metal layer Mn+1 and the virtual metal blocks on the metal layer Mn+2 are staggered, where n+2≤L, and n and L are both positive integers. Because the virtual metal blocks are staggered, effective areas of regions, where parasitic capacitances are generated, between the virtual metal blocks can be reduced, thereby reducing the parasitic capacitances between the virtual metal blocks, reducing the charges collected on the virtual metal blocks during the manufacturing process, and improving the yield of the semiconductor structure manufacturing.

The plurality of metal layers includes a first metal layer, a second metal layer, and a third metal layer. The height relationship among the three metal layers may be arbitrary, that is, the first metal layer may be higher than the second metal layer, and the second metal layer may be higher than the third metal layer. The first metal layer may also be lower than the second metal layer, and the second metal layer may be lower than the third metal layer. Alternatively, the second metal layer may be higher than the first metal layer, and the first metal layer may be higher than the third metal layer. The height relationship is not limited thereto.

For example, the first metal layer is a metal layer Mn, the second metal layer is a metal layer Mn+1, and the third metal layer is a metal layer Mn+2.

A signal line is selected as a target signal line 107 from at least one signal line on the first metal layer. A virtual metal block, on the first metal layer, closest to the target signal line 107 is marked as a first virtual metal block 108. A virtual metal block, on the second metal layer, closest to the target signal line 107 is marked as a second virtual metal block 109. A virtual metal block, on the third metal layer, closest to the target signal line 107 is marked as a third virtual metal block 110.

It should be noted that when the distance between each virtual metal block and the target signal line 107 is calculated, a distance between a geometric center of a projection of the virtual metal block on the substrate and a geometric center of a projection of the target signal line 107 on the substrate may be calculated.

A second distance between a projection of the target signal line on the substrate and a projection of the second virtual metal block on the substrate is greater than a first distance between the projection of the target signal line on the substrate and a projection of the first virtual metal block on the substrate. A third distance between the projection of the target signal line on the substrate and a projection of the third virtual metal block on the substrate is greater than the first distance. The distance between the second virtual metal block and the target signal line and the distance between the third virtual metal block and the target signal line are farther than the distance between the first virtual metal block and the target signal line, so that the parasitic capacitances between the target signal line and the virtual metal blocks on the second metal layer and the third metal layer can be reduced. Furthermore, the distance between the first virtual metal block 108 and the target signal line 107 is shorter, to ensure the uniformity of the lines on the first metal layer.

In the foregoing technical solution, the virtual metal blocks in each metal layer are staggered in the direction perpendicular to the substrate, so that the parasitic capacitances between the virtual metal blocks can be effectively reduced. Under the prerequisite that the virtual metal blocks in each metal layer are staggered in the direction perpendicular to the substrate, the virtual metal blocks on the second metal layer and the third metal layer are farther away from the target signal line, and the virtual metal blocks on the first metal layer are closer to the target signal line, to ensure the uniformity of the lines on the first metal layer, and reduce the parasitic capacitances between the target signal line and the virtual metal blocks on the second metal layer and the third metal layers, thereby improving the quality of signals transmitted by the target signal line.

In an embodiment, the projections, on the substrate, of the virtual metal blocks on the plurality of metal layers does not overlap, that is, the projections, on the substrate, of the virtual metal blocks on all of the metal layers provided with the virtual metal blocks does not overlap, so that an effective area of a region, where a parasitic capacitance is generated, between any two virtual metal blocks can be further reduced, thereby reducing the parasitic capacitance of any two virtual metal blocks.

In an embodiment, the virtual metal blocks on each metal layer are distributed in an array, to improve the uniformity of the lines on each metal layer, avoid that a dish-shaped metal layer is generated when the semiconductor structure is manufactured, and improve the yield of the semiconductor structure.

In an embodiment, a projection matrix, on the substrate, of the virtual metal blocks on the first metal layer and a projection matrix, on the substrate, of the virtual metal blocks on another metal layer are arranged to cross each other, and the another metal layer is a metal layer other than the first metal layer. In other words, each of the projection, on the substrate, of some or all of the virtual metal blocks on the another metal layer is located between projections, on the substrate, of two virtual metal blocks on the first metal layer. Alternatively, each of the projection, on the substrate, of some or all of the virtual metal blocks on the first metal layer may be located between projections, on the substrate, of two virtual metal blocks on the another metal layer. Through such a disposal, it is ensured that the projections, on the substrate, of the virtual metal blocks on each metal layer does not overlap, to reduce the parasitic capacitances between the virtual metal blocks, make the lines in each metal layer uniform, and improve the yield of the semiconductor structure.

In an embodiment, there is a projection, of a virtual metal block on the third metal layer, between projections of the virtual metal blocks on the first metal layer, to ensure that the distance between the third virtual metal block on the third metal layer and the target signal line is greater than the distance between the first virtual metal block on the first metal layer and the target signal line, reduce the parasitic capacitances between the target signal line and the virtual metal blocks on the third metal layer, and further reduce the impact of disposing the virtual metal blocks to be staggered on the uniformity of the lines on the first metal layer and the third metal layer, so that the lines on the first metal layer and the third metal layer are more uniform.

In an embodiment, there is a projection of a virtual metal block on the third metal layer between the projections of adjacent virtual metal blocks in the same row on the first metal layer. With reference to FIG. 8, there is a projection of a virtual metal block on the metal layer Mn+2 between projections of adjacent virtual metal blocks in the same row on the metal layer Mn. Through such a disposal, a gap between two adjacent virtual metal blocks on the first metal layer can be fully used, under the prerequisite that the virtual metal blocks on each layer are staggered, to make the lines on each metal layer uniform.

In an embodiment, projections of two adjacent virtual metal blocks on the first metal layer are in contact with the projections of the virtual metal blocks on the third metal layer. With reference to FIG. 8, projections of adjacent virtual metal blocks in the same row on the metal layer Mn are in contact with the projections of the virtual metal blocks on the metal layer Mn+2. Through such a disposal, the density of the virtual metal blocks on each metal layer can be improved, so that when the dense region and the sparse region of the signal lines are relatively different, the densities of the dense region and the sparse region can be effectively balanced, to ensure the uniformity of the lines on each metal layer.

In an embodiment, there is a projection of a virtual metal block on the second metal layer between projections of two adjacent virtual metal blocks on the third metal layer. On the one hand, it is ensured that the distance between the second virtual metal block on the second metal layer and the target signal line is greater than the distance between the first virtual metal block on the first metal layer and the target signal line. On the other hand, it is also ensured that the distance between the third virtual metal block on the third metal layer and the target signal line is greater than the distance between the first virtual metal block on the first metal layer and the target signal line, to reduce the parasitic capacitances between the target signal line and the virtual metal blocks on the second metal layer and the third metal layer, and further reduce the impact of disposing the virtual metal blocks to be staggered on the uniformity of the lines on the first metal layer, the second metal layer, and the third metal layer, so that the lines on the three metal layers are more uniform.

In an embodiment, there is a projection of a virtual metal block on the second metal layer between the projections of adjacent virtual metal blocks in the same column on the third metal layer. With reference to FIG. 8, there is a projection of a virtual metal block on the metal layer Mn+1 between projections of adjacent virtual metal blocks in the same column on the metal layer Mn+2. Through such a disposal, a gap between two adjacent virtual metal blocks on the third metal layer can be fully used, under the prerequisite that the virtual metal blocks on each layer are staggered, to make the lines on each metal layer uniform.

In an embodiment, projections of two adjacent virtual metal blocks on the third metal layer are in contact with the projections of the virtual metal blocks on the second metal layer. With reference to FIG. 8, projections of adjacent virtual metal blocks in the same column on the metal layer Mn+2 are in contact with the projections of the virtual metal blocks on the metal layer Mn+1. Through such a disposal, the density of the virtual metal blocks on each metal layer can be improved, so that when the dense region and the sparse region of the signal lines are relatively different, the densities of the dense region and the sparse region can be effectively balanced, to ensure the uniformity of the lines on each metal layer.

In an embodiment, there is a projection of a virtual metal block on the third metal layer between projections of two adjacent virtual metal blocks in the same row on the first metal layer. There is a projection of a virtual metal block on the second metal layer between projections of two adjacent virtual metal blocks in the same column on the third metal layer. The third distance between the projection of the target signal line on the substrate and the projection of the third virtual metal block on the substrate is equal to the second distance between the projection of the target signal line on the substrate and the projection of the second virtual metal block on the substrate. In this way, the parasitic capacitances between the target signal line and the virtual metal blocks on the second metal layer and the third metal layer are reduced, and the lines on the three metal years are also more uniform.

In an embodiment, the second metal layer is higher than the first metal layer, and the third metal layer is higher than the second metal layer. There is a projection of a virtual metal block on the third metal layer between projections of two adjacent virtual metal blocks in the same row on the first metal layer. There is a projection of a virtual metal block on the second metal layer between projections of two adjacent virtual metal blocks in the same column on the third metal layer. The parasitic capacitances between the virtual metal blocks on the first metal layer and the virtual metal blocks on the second metal layer are larger than these between the virtual metal blocks on the first metal layer and the virtual metal blocks on the third metal layer. A projection of a virtual metal block on the third metal layer is located between projections of two adjacent virtual metal blocks in the same row on the first metal layer. A projection of a virtual metal block on the second metal layer is located between projections of two adjacent virtual metal blocks in the same column on the third metal layer. In this way, effective areas of regions, where the parasitic capacitances are generated, between the virtual metal blocks on the first metal layer and the virtual metal blocks on the second metal layer are reduced, thereby reducing the parasitic capacitances between the virtual metal blocks on the first metal layer and the virtual metal blocks on the second metal layer.

In an embodiment, the target signal line 107 is arranged according to at least one signal line and selected from the at least one signal line. A signal line, in the dense region of signal lines, closest to the boundary of the sparse region of signal lines may be selected as the target signal line 107. The target signal line may also be selected with reference to a distance to the boundary of the dense region of signal lines and a layout direction of the signal lines, or the type of the signals transmitted by the signal lines. This is not limited herein.

In an embodiment, the projections of the virtual metal blocks on the substrate are quadrilateral. Through such a disposal, when the virtual metal blocks are arranged in an array, the space of the sparse area of signal lines can be fully used, to balance the densities of the sparse region of signal lines and the dense region of signal lines, make the lines on each metal layer uniform and improve the yield of the semiconductor structure.

In an embodiment, the target signal line 107 is used to transmit clock signals. The clock signals have relatively high requirements for rising/falling edges. A signal line that is used to transmit clock signals is used as the target signal line 107, to reduce the parasitic capacitance of the signal line used to transmit the clock signal, and ensure relatively steep rising/falling edges of the clock signals.

Another embodiment of the present disclosure provides a semiconductor structure, including a substrate, a first metal layer, a second metal layer, and a third metal layer. The first metal layer is the bottom metal layer. The second metal layer is higher than the first metal layer. The third metal layer is higher than the second metal layer.

The three metal layers are all provided with signal lines and a plurality of virtual metal blocks distributed in arrays. A signal line on the first metal layer is selected as a target signal line. A first virtual metal block is located on the first metal layer. A second virtual metal block is located on the second metal layer. A third virtual metal block is located on the third metal layer.

There is a projection of a virtual metal block on the third metal layer between projections of two adjacent virtual metal blocks in a same row on the first metal layer. There is a projection of a virtual metal block on the second virtual metal block between projections of two adjacent virtual metal blocks in a same column on the third metal layer. A third distance between a projection of the target signal line on the substrate and a projection of the third virtual metal block on the substrate is equal to a second distance between the projection of the target signal line on the substrate and a projection of the second virtual metal block on the substrate.

In the foregoing technical solution, through such a disposal, the virtual metal blocks in the three metal layers are staggered in a direction perpendicular to the substrate, so that the parasitic capacitances between the virtual metal blocks can be effectively reduced. Under the prerequisite that the virtual metal blocks in each metal layer are staggered in the direction perpendicular to the substrate, the virtual metal blocks on the second metal layer and the third metal layer are farther away from the target signal line, and the virtual metal blocks on the first metal layer are closer to the target signal line, to ensure the uniformity of the lines on the target metal layer, and reduce the parasitic capacitances between the target signal line and the virtual metal blocks on the other metal layers. A projection of a virtual metal block on the third metal layer is located between projections of the virtual metal blocks on the first metal layer, and a projection of a virtual metal block on the second metal layer is located between projections of the virtual metal blocks on the third metal layer, so that effective areas of regions, wherein the parasitic capacitances are generated, between the virtual metal blocks on the first metal layer and the virtual metal blocks on the second metal layer, thereby reducing the parasitic capacitances.

Those skilled in the art may easily figure out other implementations of the present disclosure after considering the specification and practicing the invention disclosed herein. The present disclosure is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. A semiconductor structure, comprising a plurality of metal layers and a substrate, wherein the plurality of metal layers comprises a first metal layer, a second metal layer, and a third metal layer;
   a plurality of virtual metal blocks and at least one signal line are disposed on the metal layers;
   the virtual metal blocks on the metal layers are staggered in a direction perpendicular to the substrate;
   a second distance between a projection of a target signal line on the substrate and a projection of a second virtual metal block on the substrate is greater than a first distance between the projection of the target signal line on the substrate and a projection of a first virtual metal block on the substrate; and the target signal line is located on the first metal layer;
   a third distance between the projection of the target signal line on the substrate and a projection of a third virtual metal block on the substrate is greater than the first distance; and
   the first virtual metal block is a virtual metal block, in the first metal layer, closest to the target signal line, the second virtual metal block is a virtual metal block, in the second metal layer, closest to the target signal line, and the third virtual metal block is a virtual metal block, in the third metal layer, closest to the target signal line;
   wherein projections, on the substrate, of the virtual metal blocks on the plurality of metal layers does not overlap;
   wherein the virtual metal blocks on each metal layer are arranged in an array;
   wherein a projection matrix, on the substrate, of the virtual metal blocks on the first metal layer and a projection matrix, on the substrate, of the virtual metal blocks on the second metal layer are arranged to cross each other; and
   a projection matrix, on the substrate, of the virtual metal blocks on the first metal layer and a projection matrix, on the substrate, of the virtual metal blocks on the third metal layer are arranged to cross each other.

2. The semiconductor structure according to claim 1, wherein the second metal layer is higher than the first metal layer, and the third metal layer is higher than the second metal layer.

3. The semiconductor structure according to claim 1, wherein the target signal line is arranged according to the at least one signal line and selected from the at least one signal line.

4. The semiconductor structure according to claim 1, wherein the projections of the virtual metal blocks on the substrate are quadrilaterals.

5. The semiconductor structure according to claim 1, wherein the signal line is used to transmit a clock signal.

6. The semiconductor structure according to claim 1, wherein there is a projection, of one of the virtual metal blocks on the third metal layer, between projections of the virtual metal blocks on the first metal layer.

7. The semiconductor structure according claim 6, wherein two adjacent virtual metal blocks on the first metal layer are in a same row.

8. The semiconductor structure according to claim 7, wherein projections, on the substrate, of two adjacent virtual metal blocks on the first metal layer are in contact with projections, on the substrate, of the virtual metal blocks on the third metal layer.

9. The semiconductor structure according to claim 1, wherein there is a projection, on the substrate, of one of the virtual metal blocks on the second metal layer, between projections, on the substrate, of two adjacent virtual metal blocks on the third metal layer.

10. The semiconductor structure according claim 9, wherein two adjacent virtual metal blocks on the third metal layer are in a same column.

11. The semiconductor structure according to claim 10, wherein the projections, on the substrate, of two adjacent virtual metal blocks on the third metal layer are in contact with projections, on the substrate, of the virtual metal blocks on the second metal layer.

12. The semiconductor structure according to claim 11, wherein the third distance is equal to the second distance.

* * * * *